United States Patent [19]

Kammeyer et al.

[11] Patent Number: 4,736,392
[45] Date of Patent: Apr. 5, 1988

[54] DEMODULATOR FOR DIGITAL FM SIGNALS

[75] Inventors: Karl-Dirk Kammeyer; Wolfgang Tobergte, both of Hamburg, Fed. Rep. of Germany

[73] Assignee: Blaupunkt-Werke GmbH, Hildesheim, Fed. Rep. of Germany

[21] Appl. No.: 857,859

[22] Filed: Apr. 30, 1986

[30] Foreign Application Priority Data

May 15, 1985 [DE] Fed. Rep. of Germany ....... 3517485

[51] Int. Cl.$^4$ .................... H04L 27/14; H04B 1/10
[52] U.S. Cl. ............................... 375/80; 375/103; 364/724; 333/18
[58] Field of Search ............... 375/12, 14, 80, 101, 375/103; 333/18; 364/724, 824, 825

[56] References Cited

U.S. PATENT DOCUMENTS

| | | | |
|---|---|---|---|
| 3,803,501 | 4/1974 | Jones, Jr. ................. | 375/80 |
| 3,979,701 | 9/1976 | Tomozawa ................ | 364/825 |
| 4,184,129 | 1/1980 | Danjon et al. ............ | 333/18 |
| 4,506,228 | 3/1985 | Kammeyer ............... | 375/82 |
| 4,584,600 | 4/1986 | Baker ....................... | 364/724 |

FOREIGN PATENT DOCUMENTS 3444449 11/1984 Fed. Rep. of Germany.

Primary Examiner—Robert L. Griffin
Assistant Examiner—Marianne Huseman
Attorney, Agent, or Firm—Frishauf, Holtz, Goodman & Woodward

[57] ABSTRACT

For compensation of the effects of multi-path reception, a cascade distortion corrector composed of distortion corrector blocks successively connected in series is provided for a digital FM demodulator that needs non-recursive filtering. Each distortion corrector block produces an increase of the phase rotation and of the propagation time as well as a reduction of the reflection factor of the input signal. The cascade distortion corrector leads to a significant reduction of the hardware expense compared to the previously used transversal type filter structures. Sufficient compensation of the multi-path reception effects can be obtained by connecting five or six distortion corrector blocks one after the other.

14 Claims, 4 Drawing Sheets $$a_n = (-\rho)^{2^{n-1}} \cdot \cos(2^{n-1} \psi)$$
$$b_n = (-\rho)^{2^{n-1}} \cdot \sin(2^{n-1} \psi)$$

DISTORTION CORRECTOR BLOCKS $a_n = (-\rho)^{2^{n-1}} \cdot \cos(2^{n-1}\psi)$
$b_n = (-\rho)^{2^{n-1}} \cdot \sin(2^{n-1}\psi)$

DEMODULATOR FOR DIGITAL FM SIGNALS

This invention concerns a demodulator for frequency modulated (FM) signals in digital form equipped with non-recursive filters constituted as a distortion-correcting network for filtering the signals and with an analog-to-digital converter for digitizing the frequency modulated signals, as well as an analog band-pass filter ahead of the input of the analog-to-digital converter and having a relatively narrow pass-band.

Published European Patent Application EP No. 82 105 412.9 (Publication No. 80 014), corresponding to U.S. Pat. No. 4,506,228, Mar. 19, 1985, Karl-Dirk KAMMEYER, discloses a digital demodulator for FM signal which include, at the intermediate frequency output of the mixer stage, a broad-band analog band-pass filter for filtering the input to a following analog-to digital converter. The analog prefiltering is designed to make possible subharmonic sampling of the output signal of the IF mixer stage. The low-pass filters follow digital multipliers and filter out the actually useful signal. The digital signals thus obtained are prepared for producing the low-frequency signals in a following circuit.

The interrelation between the prefiltering band width, on the one hand, and the sampling frequency requirement, on the other, are shown in the above-mentioned European patent application. It is sought to obtain, first, an effective reduction of the sampling frequency by a correspondingly selected small band width of prefiltering and at the same time to start with sufficiently broad analog prefilters so that the signal that must be filtered out digitally later is not distorted by the unfavorable phase and amplitude characteristics of the analog filter. In this known demodulator a compromise prefiltering band-width is disclosed which is substantially larger than the band-width of the signal to be received.

Difficulties in connection with the dynamic requirements on the analog-to-digital converter can nevertheless arise in practical application of the above-described known digital demodulator. ON account of the prefiltering band-width that is distinctly greater than the actual IF band-width, the circumstance cannot be excluded that one or another nearby transmitter will be found in the pass-band in a channel adjacent to the transmitter which it is desired to receive. The signal level of the adjacent channel transmitter can lie substantially higher than that of the transmitter to which the receiver is tuned. This is particularly to be expected when the place of reception continuously changes, as is the case for a receiver in a motor vehicle. For trouble-free operation of the analog-to-digital converter, the maximum value of the combined receiving signal is significant, however, so that the analog-to-digital converter must be able to cope with the dynamics of this situation.

In order to be able to tune in equally well even a weak transmitter in a channel adjacent to a strong transmitter, it has been necessary in the prior state of the art to use analog-to-digital converters having a very high resolution in order to have a sufficient dynamic reserve, a necessity which produces difficulties in connection with the requirements of quick response time. The known digital demodulator is accordingly not realizable without great expense on account of the equipment expense for the analog-to-digital conversion.

In an earlier German patent application of the assignee of the present application No. P 34 44 449.1, published in November, 1986, narrow-band prefiltering is proposed in order to prevent adjacent channel transmitters from falling alongside to the signal being received in the pass-band of the analog prefilter. The narrow-band IF filtering that is now conditional upon the analog prefiltering, however, brings along with it great phase and damping distortions. In the demodulator of that earlier German application, accordingly, there is further proposed that instead of the low-pass filter of the above-described known demodulator, a distortion correcting network should be used which removes or compensates for the phase and attenuation distortions of the narrow-band prefilter. The digital distortion corrector in the form of a distortion correcting network no longer has the function of providing selective tuning, but serves rather for compensation of the far-from-ideal properties of the analog prefilter.

Since the interference by strong transmitter signals in channels adjacent to the channel of a weak transmitter signal can no longer arise, it is now possible to reduce the dynamic requirements relating to the signal being received and, furthermore, the sampling frequency of the analog-to-digital converter can also be reduced because of the small band-width of the signal to be processed.

In addition to the concerns described up to this point, the matter of suppressing multi-path reception is generally of substantial importance in a receiver. In the earlier German patent application, it was already mentioned in this connection that the non-recursive filters used as digital distortion correctors are also suitable for compensation for multi-path transmission. In FIG. 6 of that earlier patent application, a correspondingly constituted non-recursive filter is shown.

Counteracting the advantage of reduction of the non-linear distortion produced by multi-path reception obtainable by a digital distortion correction network, there is however the disadvantageous circumstance that a greater hardware expense must be incurred for a concrete technical embodiment of such a non-recursive filter. The receivers in which they are to be incorporated are thereby likewise made expensive and in many case wholly uneconomic for manufacture.

SUMMARY OF THE INVENTION

It is an object of the present invention to provide a digital demodulator equipped with a distortion correcting network which makes possible good compensation of multi-path reception and can be made available at relatively low cost.

Briefly, the distortion corrector for compensation of multi-path reception is provided by a cascade non-recursive filter constituted by a number of distortion corrector blocks connected in series, each of which provides a raising of the phase rotation and of the propagation time as well as a reduction of the reflection factor of the reflected component contained in the input signal.

An important aspect of the invention is the cascade structure provided by a number of individual partial distortion correctors connected successively one behind the other. It is advantageous in this arrangement that each partial distortion corrector can be constituted with the least possible hardware expense and thereby the total expense of a unit constituted as a cascade of several distortion correctors can be found substantially less than the expense in the case of the transversal network arrangement described in the above-identified prior German patent application.

A substantial reduction of multi-path reception is also obtained. In the connection in succession of partial distortion correctors to form a cascade extending beyond three blocks of partial distortion correction, the compensation of multi-path reception already obtained in a preceding distortion correction block is further improved in the succeeding block, with the phase rotation and the propagation time being doubled in each distortion corrector block and the reflection factor—for the case in which the amplitude of the reflection is less than "1"—is reduced by an exponential function $\rho^{2n}$. The mathematical relations are further expressed in detail below in connection with the description of the Figures. Further advantageous embodiments and developments of the invention, even for the case in which the amplitude of the reflection component is greater than "1" are likewise described in connection with the description of the drawings.

BRIEF DESCRIPTION OF THE DRAWINGS.

The invention is further described and, for better understanding, the subject of the above-mentioned prior application is also explained, with reference to the annexed drawings, in which.

DESCRIPTION OF THE ILLUSTRATED EMBODIMENTS

Figure 1:
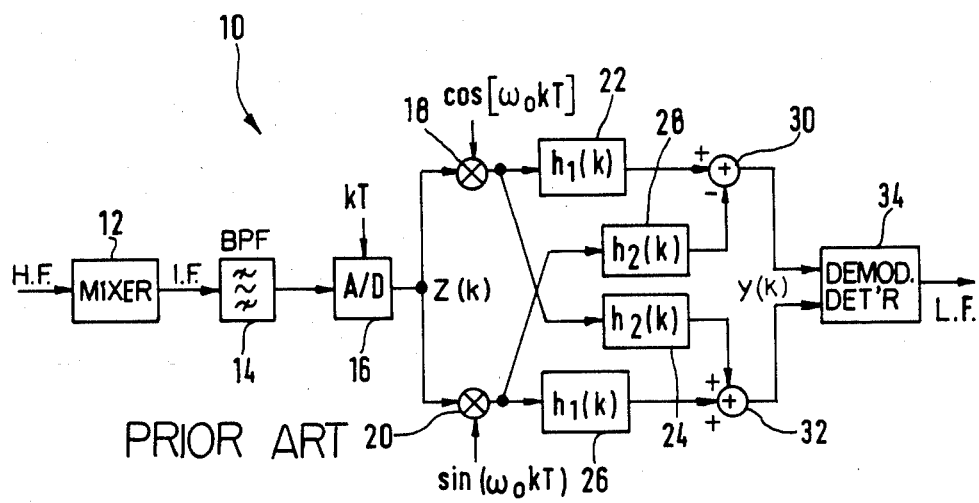
FIG. 1 is a block circuit diagram of the filter structure in the case of the demodulator proposed by the above-mentioned earlier German patent application.
Figure 2:
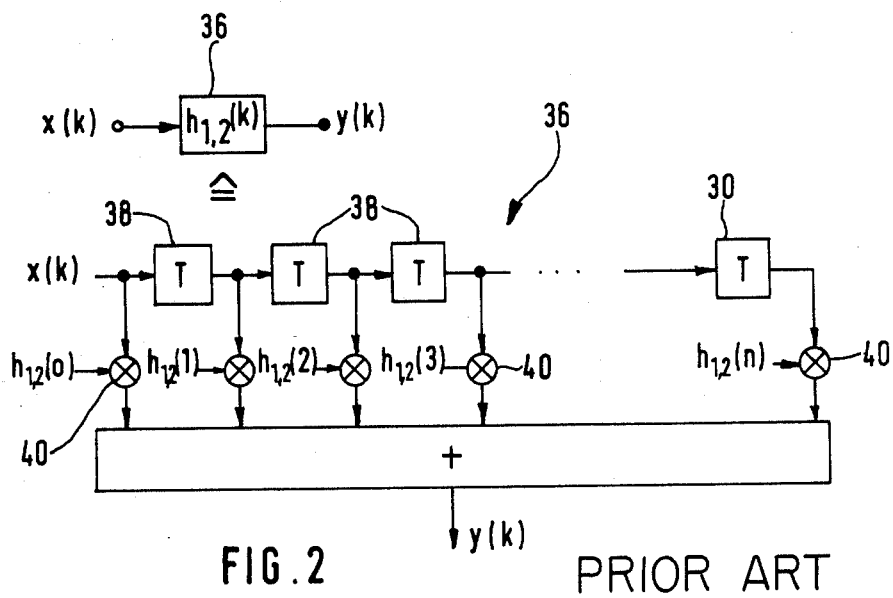
FIG. 2 is a circuit block diagram of a distortion correcting branch of the demodulator of FIG. 1.
Figure 3:
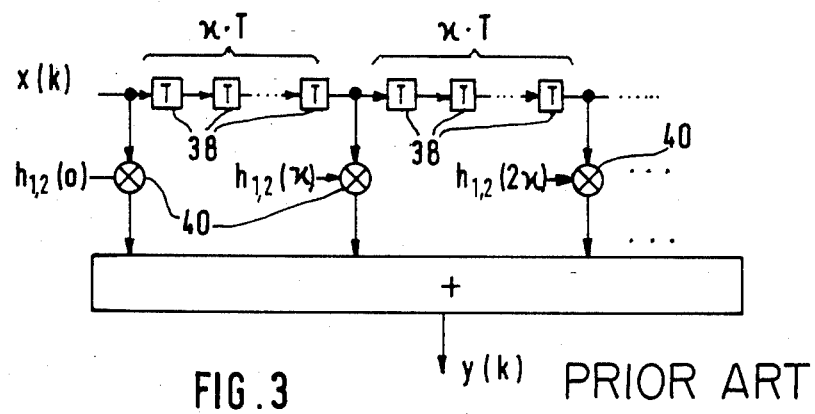
FIG. 3 is a diagram of a modified distortion correction branch for compensation of a simple reflection in the case of the demodulator of FIG. 1.

FIGS. 1-3 of the drawings show a digital demodulator which is described in the above-mentioned earlier German patent application, which may be regarded as the starting point from which the invention was developed. FIG. 1 shows the portion of a digital receiver 10 which concerns the present invention. A band-pass filter 14 is connected to follow an IF mixer 12 and supplies its output to an analog-to-digital converter 16.

The deviations of the analog band-pass filter 14 from ideal properties are compensated by the insertion of digital networks including the non-recursive filters 22, 24, 26 and 28 in the previously proposed digital demodulator. As can be seen from FIG. 1, transversal forms of filters are involved in the filter structure shown.

At the digital output of the analog-to-digital converter 16 there are connected digital multipliers 18 and 20, the former providing multiplication by a cosine function of the carrier frequency $f_o$ which appears in the converter output after sampling, whereas in the multiplier 20 a multiplication with a sine function of the same frequency is produced.

FIG. 1 shows two non-recursive filters connected respectively to the adding units 30 and 32 and also respectively connected to the multipliers 18 and 20. The outputs of the digital adding units 30 and 32 are supplied to a demodulator 34 in order to produce low-frequency signals.

In the earlier patent application mentioned above, it was in fact shown that the filter structure of FIG. 1 is also suitable for compensation of multi-path reception. If it is assumed that only a single reflection, of amplitude $\rho$ and of phase rotation $\psi$ with reference to the direct wave (complex reflection factor $r = \rho \cdot e^{-j\psi}$), the form of a non-recursive filter 36 according to the representation in FIG. 2 is simplified in that a large number of the coefficients $h_{1,2}(k)$ vanishes in the course of processing by the multipliers 40. This is taken into account by having the delay times T of the individual delay storage units or time lapse circuits 38 replaced by $\kappa \cdot \tau$, where $\kappa$ designates the quotient obtained by dividing the propagation time $\tau$ of the reflected wave by the sampling interval T. In FIG. 3, there is shown a similarly modified distortion correction branch for compensation of a simple reflection.

The calculation of the distortion correction coefficients is carried out in the case of the demodulator proposed in the earlier patent application by minimizing the error of the resulting pulse response (least error squares). This is all explained more fully in the prior patent application so that it is not necessary at this place to go into the matter further.

Figure 4:
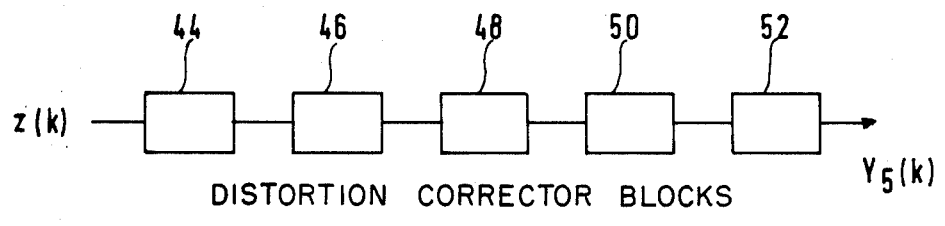
FIG. 4 is a basic schematic representation of a cascade distortion corrector consisting of several distortion correction blocks.

As shown in FIG. 4, the invention now provides a non-recursive cascade type of filter with, in the illustrated case, five distortion correction blocks 44, 46, 48, 50 and 52 connected one after the other for the compensation of multi-path reception. A received FM signal z(k) disturbed by a reflection produces the output signal y5(k), the form of which will be further explained below.

For clearer statement, the multi-path problem is formulated in complex variables, so that the received FM signal disturbed by a reflection has the following form:

$$z(k) = e^{j\phi(k)} + \rho \cdot e^{-j\psi} e^{j\phi(k \cdot \kappa)}; \text{ with } \phi(k) = \Delta\Omega \int_{-\infty}^{kT} v(\xi)d\xi \quad (1)$$

in which $\rho$=amplitude, $\psi$=phase rotation, and the propagation time $\tau = \kappa \cdot \tau$.

Figure 5:
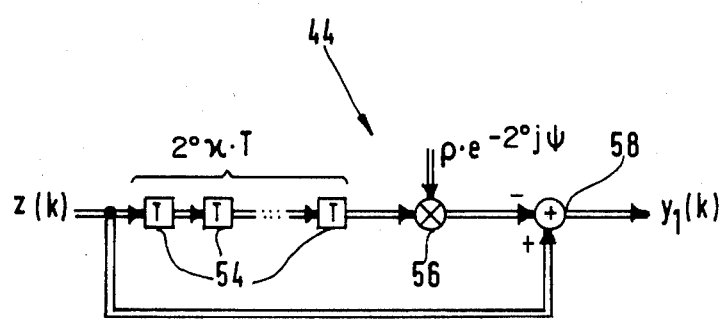
FIG. 5 is a basic diagram of a non-recursive distortion corrector corresponding to the first distortion corrector block of FIG. 4.

This signal is supplied to a system of the kind shown in FIG. 5, which shows the first distortion corrector block 44 and delay circuits 54, a multiplier 56 containing an adding unit 58. The output signal $y_1(k)$ then has the form:

$$y_1(k) = z(k) - \rho e^{-j\psi} \cdot z(k - \eta) =$$

$$e^{j\phi(k)} + \rho \cdot e^{-j\psi} \cdot e^{j\phi(k-\eta)} - \rho \cdot e^{-j\psi}e^{j\phi(k-\eta)} - \rho^2 e^{-j2\psi}e^{j\phi(k-2\eta)}$$

$$y_1(k) = e^{j\phi(k)} - \rho^2 \cdot e^{-2j\psi} e^{j\psi(k-2\tau)} \quad (2)$$

There is thus again obtained a signal disturbed by a reflection, in which the phase rotation $\psi$ and the propagation time $\tau$ are now doubled. The reflection factor now amounts to $\rho^2$ which is reduced compared to $\rho$, since in this case it is assumed that $\rho$ is less than 1.

Figure 6:
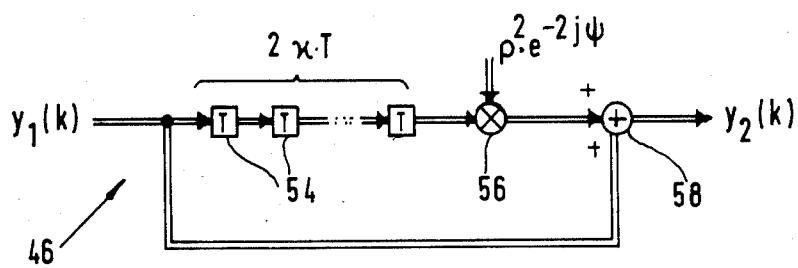
FIG. 6 is a representation similar to FIG. 5 for the second distortion correction block of FIG. 4.

The processing above described is repeated in a correspondingly modified network—here in the second distortion corrector block 46 shown in FIG. 6. The output signal $y_2(k)$ of the second distortion corrector block 46 is described, on the basis of the above consideration, as follows:

$$y_2(k) = e^{j\psi(k)} - \rho^4 e^{-4j\psi} e^{j\psi(k-4\kappa)} \quad (3)$$

The reflection factor is now reduced to $\rho^4$. By means of the further distortion corrector blocks 48, 50 and 52, this process is repeated often enough for the reflection factor to become sufficiently small. At the output of the nth distortion corrector block, the following reflection parameter is obtained:

$$\rho_n = \rho^{2^n}, \psi_n = 2^n\psi, \kappa_n = 2^n\cdot\kappa.$$

It has been found that for practical application cases, five or at most six distortion corrector blocks are as a rule sufficient in order to obtain effective compensation of multi-pass reception.

Figure 7:
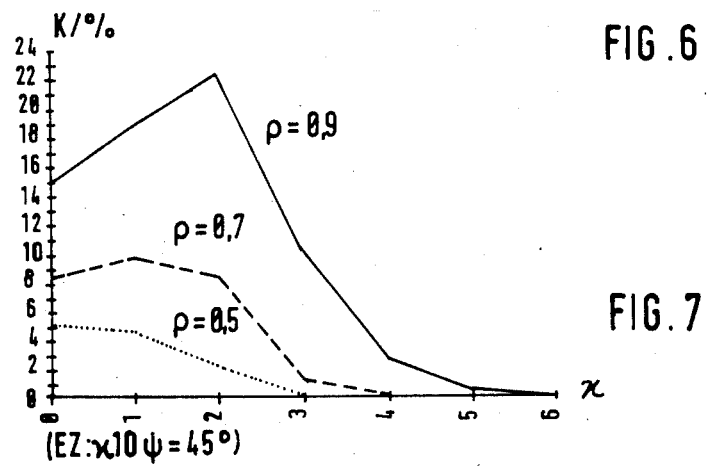
FIGS. 7 and 8 are both diagrams for the coefficient of harmonic distortion as a function of the number of distortion correction blocks used.
Figure 8:
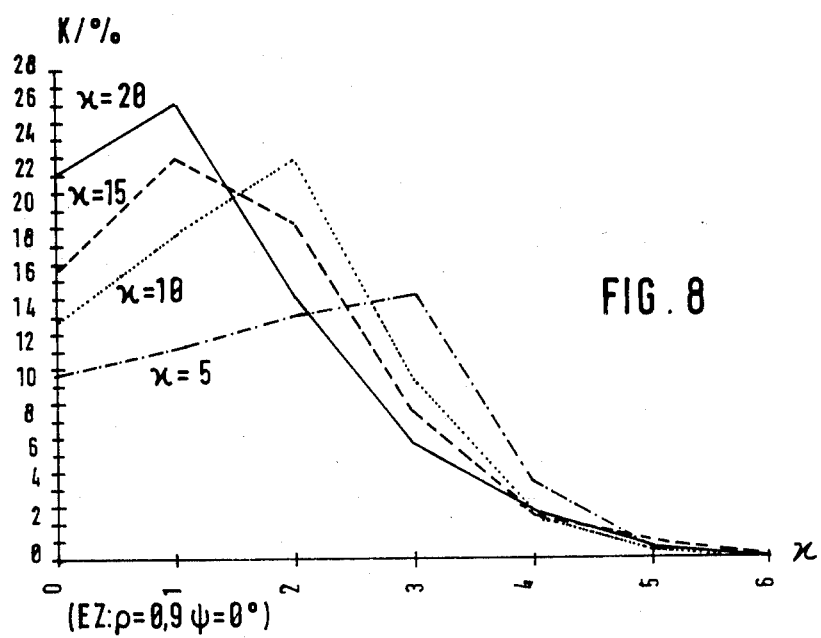

For further clarification of the subject, the harmonic distortion coefficient (non-linear distortion coefficient) of the demodulated signal is graphed in FIGS. 7 and 8 as the function of the number n of the distortion corrector blocks 44–52. The various curves in FIG. 7 in each case relate to different reflection factors $\rho$. In FIG. 8, the harmonic distortion coefficient in percent is shown for various values of $\kappa$ (=quotient obtained by dividing the propagation time $\tau$ of the reflected wave by the sampling interval). As can be seen, the harmonic distortion coefficient K reaches a vanishingly small value with five distortion corrector blocks.

A significant advantage of the invention consists in that the modified structure for the distortion corrector leads to the remarkable reduction of the hardware expense.

Figure 9:
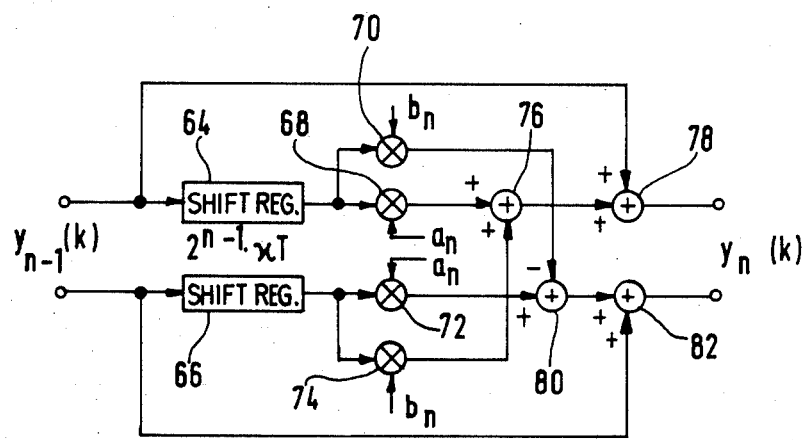
FIG. 9 is a schematic circuit block diagram for making clear the hardware requirements of a distortion correction.

The hardware structure of a distortion corrector is bound by replacing the complex number description used in FIG. 5 and FIG. 6 by real operation. FIG. 9 shows in general form the constitution of an nth distortion corrector block.

The two inputs of the distortion corrector block are resectively connected to a first and a second signal path which respectively contain shift registers 64 and 66. The input of the shift register 64 is connected to a first adding unit 78, while the input of the other shift register 66 is connected to another adding unit 82.

Two multipliers 68 and 70 are connected to the shift register 64. The first multiplier 68 is connected with the first adding unit 76, while the second multiplier 70 is connected with a third adding unit 80 in the second signal path.

At the output of the other shift register 66 is located a third multiplier 72 which is connected to a third adding unit 80 and, furthermore, the output of the shift register 66 is also connected to a fourth multiplier 74 which is connected with the first adding unit 76. The two multipliers 68 and 72 are also provided with the same multiplying factor $a_n$, which may be a signal source providing a constant voltage of a magnitude representative of the multiplying factor in question, as symbolically shown in FIG. 9

The advantage obtained by the invention with respect to the expense involved is made clear by comparison of the cascade distortion corrector involved in the apparatus of the invention with the transversal structure of the known recursive filter disclosed for use in the digitial demodulator recommended in the above-mentioned earlier patent application.

In total, 4n multiplications need to be carried out in the use of n cascade blocks such as the distortion corrector blocks 44–52. A comparable transversal distortion corrector has a length of $2^n \cdot \kappa$ and therefore requires $4 \cdot 2^n$ multiplications. The saving in multiplication resulting from the cascade structure used in the invention accordingly amounts to $$G = 2^n/n$$

That therefore signifies a factor of 10 for n=6. The number of additions is reduced likewise by such a factor. The capacity of the signal state storage unit is the same in both cases, i.e. a total delay of $2^n \cdot \kappa$ sample intervals is needed.

The case of $\rho < 1$ was assumed for the cascade distortion corrector described up to this point, utilizing the distortion corrector blocks 42–52. The cascade system can be extended, however, to include also the case of $\rho > 1$. A modified structure is then to be used for the individual distortion corrector blocks, regarding which FIG. 10 shows for this purpose in schematic representation an nth distortion corrector block for $\rho > 1$.

The input signal $y_{n-1}(k)$ is supplied to a multiplier 84 and also to a delay circuit 88. An adding unit 86 is connected to the multiplier 84 which is also connected with the output of the delay circuit 88.

Figure 10:
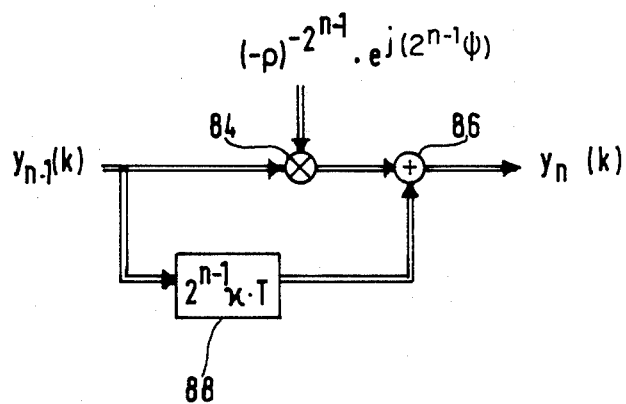
FIG. 10 is a basic diagram of a distortion corrector block for the case of a relative amplitude of the reflection component which is greater than "1".

In the case illustrated by FIG. 10, one more correction multiplication, in this case with the factor $r^{-1} = \rho^{-1} \cdot e^{+j\psi}$ is to be carried out ahead of the first distortion corrector block.

Although the invention has been described with reference to particular illustrative examples, it will be understood that variations and modifications are possible within the inventive concept.

When there is multi-path transmission from a transmitter to a receiver by radio, in addition to the path of direct radiation from the transmitter to the receiver there may be a number of paths involving reflections from ground, buildings, or the like and there may be a refracted wave path higher than the direct path in case of a temperature inversion in the atmosphere. These additional paths involve longer transmission times and the signals received over them are generally referred to as reflected wave components.

What is claimed is:

1. Demodulator for frequency modulated signals in digital form comprising
   an analog-to-digital converter for converting analog frequency modulated signals into digital form and a band-pass filter ahead of the input of said converter and having a narrow pass-band for reduction of adjacent-channel interference, said demodulator further comprising, for suppression of effects of multi-path reception and for compensating for distortion produced by said band-pass filter:

a non-recursive cascade distortion corrector unit connected for filtering digital signals produced by said converter and comprising several (n) distortion corrector blocks connected in tandem one after the other, each of said corrector blocks (44, 46, 48, 50, 52) having an input, signal delay means and multiplier means and being constituted for raising the phase rotation ($\psi$) and the propagation time ($\tau$) and reducing the reflected wave amplitude ($\rho$) of signals supplied to the input of the corrector block, each of said corrector blocks delaying, by said signal delay means, said supplied signals for a single interval of time ($2^{n-1}\kappa T$) and every said multiplier means in each of said corrector blocks multiplying, by a complex reflection factor, the signals delayed by said delay means.

2. Demodulator according to claim 1, in which said cascade distortion corrector is constituted for responding to a received FM signal disturbed by reflection and having the form $$z(k) = e^{j\phi(k)} + \rho \cdot e^{-j\psi} e^{j\phi(k-\kappa)}; \text{ with } \phi(k) = \Delta\Omega \int_{-\infty}^{kT} v(\xi)d\xi \quad (1)$$

to produce an output signal of the following form:

$$y_1(k) = z(k) - \rho e^{-j\psi} \cdot z(k - \eta) =$$
$$e^{j\phi(k)} + \rho \cdot e^{-j\psi} \cdot e^{j\phi(k-\eta)} - \rho \cdot e^{-j\psi} e^{j\phi(k-\eta)} - \rho^2 e^{-j2\psi} e^{j\phi(k-2\eta)}$$
$$y_1(k) = e^{j\phi(k)} - \rho^2 \cdot e^{-2j\psi} e^{j\phi(k-2\eta)} \quad (2)$$

in which $\Delta\Omega$ signifies rotary frequency swing; v(t)=modulating low-frequency signal; $\rho$=amplitude of the reflected wave; $\psi$=phase rotation of the reflected wave; $\tau=\kappa\cdot T=$ propagation time; T=sampling interval; $\rho=$ angle; $\chi=$quotient obtained by dividing the propagation time of the reflected wave by the sampling interval.

3. Demodulator according to claim 2, in which a second corrector block (46) having its input connected for receiving the output of said first corrector block (44) is constituted for responding to a signal at said input by producing an output which has the form;

$$y_2(k)=e^{j\psi(k)}-\rho^4 e^{-4j\psi} e^{j\phi(k-4\kappa)} \quad (3)$$

4. Demodulator according to claim 3, in which the output of said cascade distortion corrector obtained from the output of the last in cascade of said corrector blocks exhibits the following reflection parameters:

$$\rho_n=\rho^{2^n}, \psi_n=2^n\psi, \kappa_n=2^n\cdot\kappa,$$

in which n is the number of corrector blocks in said cascade distortion corrector.

5. Demodulator according to claim 2, in which the output of said cascade distortion corrector obtained from the output of the last in cascade of said corrector blocks exhibits the following reflection parameters:

$$\rho_n=\rho^{2^n}, \psi_n=2^n\psi, \kappa_n=2^n\cdot\kappa,$$

in which n is the number of corrector blocks in said cascade distortion corrector.

6. Demodulator according to claim 1, in which the output of said cascade distortion corrector obtained from the output of the last in cascade of said corrector blocks exhibits the following reflection parameters:

$$\rho_n=\rho^{2^n}, \psi_n=2^n\psi, \kappa_n=2^n\cdot\kappa,$$

in which n is the number of corrector blocks in said cascade distortion corrector.

7. Demodulator according to claim 1, in which said cascade distortion corrector is constituted with not less than five nor more than six of said distortion corrector blocks.

8. Demodulator according to claim 7 wherein the nth distortion corrector block incorporates a delay of said signals supplied the input thereof, before supplying said signals to said multiplier thereof, which is equal to $2^{n-1}\cdot\kappa\cdot T$ and in said multiplier said delayed signals are multiplied by the complex reflection factor $\rho^{2^{n-1}}\cdot e^{-j(2^{n-1}\psi)}$, where n is the ordinal number of the respective distortion corrector in said cascade, $\psi$ is the phase rotation of the reflected wave, $\kappa$ is the quotient obtained by dividing the propagation time of the reflected wave by the sampling interval and T is the sampling interval.

9. Demodulator according to claim 1, in which each of said corrector blocks of said cascade distortion corrector has two signal paths in each of which there is provided a shift register (64, 66) followed by a first (68, 72) and a second (70, 74) multiplier as well as a first (76, 80) and a second (78, 82) adding unit.

10. Demodulator according to claim 9, in which the signal ($y_{n-1}(k)$) supplied to a first of said shift registers (64) is also supplied to the second adding unit (78) of the same signal path and that the signal supplied to the second shift register (66) is also suplied to the second adding unit (82) of the signal path to which said second shift register pertains.

11. Demodulator according to claim 10, in which the output of said first shift register (64) is connected through said second multiplier (70) in the signal path in which said shift register is located with said first adding unit (80) in the signal path of said second shift register (66) and said output of said second shift register (66) is connected through said second multiplier (74) of the signal path in which said second shift register is located with the first adding unit (76) in the signal path in which said first shift register is located.

12. Demodulator according to claim 1, for coping with received signals in which the refelection amplitude is greater than unity, and in which each corrector block of said cascade distortion corrector is provided with a first signal path in which is located a multiplier (84) and a second signal path in which is located a delay circuit (88), said multiplier (84) and said delay circuit (88) being connected with a common adding unit (86).

13. Demodulator according to claim 12, in which an additional multiplier is provided between the output of said analog-to-digital converter and the first corrector block of said cascade distortion corrector for producing a preliminary correction multiplication of signals by the factor $r^{-1}=\rho^{-1}\cdot e^{+j\psi}$.

14. Demodulator according to claim 1 wherein the nth distortion corrector block incorporates a delay of said signals supplied the input thereof, before supplying said signals to said multiplier thereof, which is equal to $2^{n-1}\cdot\kappa\cdot T$ and in said multiplier said delayed signals are multiplied by the complex reflection factor $\rho^{2^{n-1}} e^{-j(2^{n-1}\psi)}$, where n is the ordinal number of the respective distortion corrector in said cascade, $\psi$ is the phase rotation of the reflected wave, $\kappa$ is the quotient obtained by dividing the propagation time of the reflected wave by the sampling interval and T is the sampling interval.

* * * * *